(12) United States Patent
Takayama et al.

(10) Patent No.: US 12,021,468 B2
(45) Date of Patent: Jun. 25, 2024

(54) MOTOR DRIVE DEVICE, ELECTRIC BLOWER, ELECTRIC VACUUM CLEANER, AND HAND DRYER

(71) Applicant: Mitsubishi Electric Corporation, Tokyo (JP)

(72) Inventors: Yuji Takayama, Tokyo (JP); Haruka Matsuo, Tokyo (JP); Kazunori Hatakeyama, Tokyo (JP); Tomoyuki Kamiyama, Tokyo (JP); Takuya Furuyama, Saitama (JP); Masami Yorita, Saitama (JP); Takanobu Kondo, Saitama (JP)

(73) Assignee: Mitsubishi Electric Corporation, Tokyo (JP)

( * ) Notice: Subject to any disclaimer, the term of this patent is extended or adjusted under 35 U.S.C. 154(b) by 871 days.

(21) Appl. No.: 16/976,593

(22) PCT Filed: Mar. 23, 2018

(86) PCT No.: PCT/JP2018/011937
§ 371 (c)(1),
(2) Date: Aug. 28, 2020

(87) PCT Pub. No.: WO2019/180972
PCT Pub. Date: Sep. 26, 2019

(65) Prior Publication Data
US 2021/0050811 A1      Feb. 18, 2021

(51) Int. Cl.
*H02P 27/08*      (2006.01)
*A47K 10/48*     (2006.01)
(Continued)

(52) U.S. Cl.
CPC ............ *H02P 27/085* (2013.01); *A47K 10/48* (2013.01); *A47L 5/24* (2013.01); *A47L 9/2842* (2013.01);
(Continued)

(58) Field of Classification Search
CPC .. H02P 23/0027; H02P 27/045; H02P 27/085; H02P 2209/13; A47L 9/2842;
(Continued)

(56) References Cited

U.S. PATENT DOCUMENTS 8,810,052 B2 *   8/2014   Kishibata ............... G05B 19/00
                                                                    361/699
2004/0231090 A1 *  11/2004   Kushida .............. F04D 29/5813
                                                                    15/326

(Continued)

FOREIGN PATENT DOCUMENTS

JP      2009-225500 A      10/2009
JP      2016-195532 A      11/2016
(Continued)

OTHER PUBLICATIONS

International Search Report of the International Searching Authority dated Jun. 19, 2018 for the corresponding international application No. PCT/JP2018/011937 (and English translation).
(Continued)

*Primary Examiner* — Gabriel Agared
(74) *Attorney, Agent, or Firm* — POSZ LAW GROUP, PLC

(57) ABSTRACT

A motor drive device includes a single-phase inverter that converts a direct-current voltage into an alternating-current voltage applied to a motor. The motor drive device includes a control power supply outputting power having a voltage lower than the direct-current voltage. The motor drive device includes a drive signal generation unit driven by the
(Continued)

power. The drive signal generation unit generates drive signals driving switching elements of the inverter. The motor drive device includes a power supply switch operating so as to allow supply of the power from the control power supply to the drive signal generation unit when a rotation speed of the motor is higher than a threshold. The power supply switch operates so as to stop the supply of the power from the control power supply to the drive signal generation unit when the rotation speed is lower than the threshold.

14 Claims, 13 Drawing Sheets

(51) Int. Cl.
*A47L 5/24* (2006.01)
*A47L 9/28* (2006.01)
*H02P 27/04* (2016.01)
*H01L 29/16* (2006.01)
*H01L 29/20* (2006.01)
*H01L 29/78* (2006.01)

(52) U.S. Cl.
CPC .......... *A47L 9/2894* (2013.01); *H02P 27/045* (2013.01); *H01L 29/1602* (2013.01); *H01L 29/1608* (2013.01); *H01L 29/2003* (2013.01); *H01L 29/7819* (2013.01)

(58) Field of Classification Search
CPC ........ A47L 9/2894; A47L 9/2889; A47L 5/24; H01L 29/78; H01L 29/1602; H01L 29/2003; H01L 29/1608; H01L 29/7819; A47K 10/48
USPC ........................................................ 318/503
See application file for complete search history.

(56) References Cited

U.S. PATENT DOCUMENTS

| | | | |
|---|---|---|---|
| 2011/0109168 A1* | 5/2011 | Morimoto | H01H 47/325 307/104 |
| 2012/0018404 A1* | 1/2012 | Matsuo | H01H 9/542 218/8 |
| 2013/0234446 A1* | 9/2013 | Kishibata | B60L 50/13 290/38 R |
| 2014/0286069 A1* | 9/2014 | Shinomoto | H03K 17/161 363/131 |
| 2016/0190955 A1 | 6/2016 | Hatakeyama et al. | |
| 2016/0294394 A1 | 10/2016 | Li | |
| 2016/0344301 A1* | 11/2016 | Maruyama | H02M 7/483 |
| 2016/0365788 A1* | 12/2016 | Singh | H02P 29/02 |
| 2017/0288580 A1* | 10/2017 | Ma | H02P 6/24 |
| 2017/0305274 A1* | 10/2017 | Saha | B60L 3/003 |
| 2018/0154931 A1* | 6/2018 | Shinkawa | B62D 5/046 |
| 2021/0050811 A1* | 2/2021 | Takayama | A47L 9/2842 |
| 2021/0285415 A1* | 9/2021 | Vamvas | B63B 35/44 |

FOREIGN PATENT DOCUMENTS

| | | |
|---|---|---|
| JP | 2017-103907 A | 6/2017 |
| WO | 2015/033437 A1 | 3/2015 |
| WO | 2018/043480 A1 | 3/2018 |
| WO | 2018/047274 A1 | 3/2018 |

OTHER PUBLICATIONS

Japanese Office Action dated Jun. 1, 2021, issued in corresponding Japanese Patent Application No. 2020-507292 (and English Machine Translation).
Office Action dated Sep. 13, 2023 in corresponding Chinese Patent Application No. 201880091509.8 (and English translation).

* cited by examiner

MOTOR DRIVE DEVICE, ELECTRIC BLOWER, ELECTRIC VACUUM CLEANER, AND HAND DRYER

CROSS REFERENCE TO RELATED APPLICATION

This application is a U.S. national stage application of International Patent Application No. PCT/JP2018/011937 filed on Mar. 23, 2018, the disclosure of which is incorporated herein by reference.

TECHNICAL FIELD

The present invention relates to a motor drive device for driving a motor, and an electric blower, an electric vacuum cleaner, and a hand dryer all of which include the motor drive device.

Background

Patent Literature 1 discloses a technique for reducing regenerative power by adjusting a d-axis current which is a field weakening current.

Patent Literature

Patent Literature 1: Japanese Patent Application Laid-open No. 2017-103907

For the technique disclosed in Patent Literature 1, unfortunately, it is impossible to reduce regenerative power without generating a rotating magnetic field in a stator by carrying a current through a winding wound around the stator of a motor. For this reason, a drive device for driving a motor without generating a rotating magnetic field cannot employ the technique disclosed in Patent Literature 1. A problem with such a drive device is that a voltage applied to a power conversion electrolytic capacitor of the drive device is increased by regenerative power, which would shorten the life of the electrolytic capacitor.

SUMMARY

The present invention has been made in view of the above, and an object thereof is to obtain a motor drive device capable of preventing the shortening of the life of an electrolytic capacitor by reducing regenerative power flowing from a motor to an inverter without generating a rotating magnetic field.

In order to solve the above-mentioned problem and to achieve the object, a motor drive device according to the present invention comprises an inverter including a plurality of switching elements, the inverter converting a direct-current voltage output from a direct-current power supply into an alternating-current voltage by operation of the plurality of switching elements, and applying the alternating-current voltage to a motor. The motor drive device also comprises a control power supply outputting power having a voltage lower than the direct-current voltage, by using the direct-current voltage. The motor drive device further comprises a first signal generation unit driven by the power, the first signal generation unit generating drive signals driving the plurality of switching elements, and outputting the generated drive signals to the plurality of switching elements. The motor drive device further comprises a power supply switch operating so as to allow supply of the power from the control power supply to the first signal generation unit when a rotation speed of the motor is higher than a threshold, the power supply switch operating so as to stop the supply of the power from the control power supply to the first signal generation unit when the rotation speed is lower than the threshold.

The motor drive device according to the present invention achieves an effect of preventing the shortening of the life of an electrolytic capacitor by reducing regenerative power flowing from the motor to the inverter without generating the rotating magnetic field.

BRIEF DESCRIPTION OF DRAWINGS

FIG. 7 is a diagram illustrating an example configuration of a function of controlling an operation of a power supply switch illustrated in FIG. 1 and reducing power consumed by the drive signal generation unit and the like.

DETAILED DESCRIPTION

Hereinafter, a motor drive device, an electric blower, an electric vacuum cleaner, and a hand dryer according to an embodiment of the present invention will be described in detail with reference to the drawings. The present invention is not limited to the embodiment.

Embodiment

Figure 1:
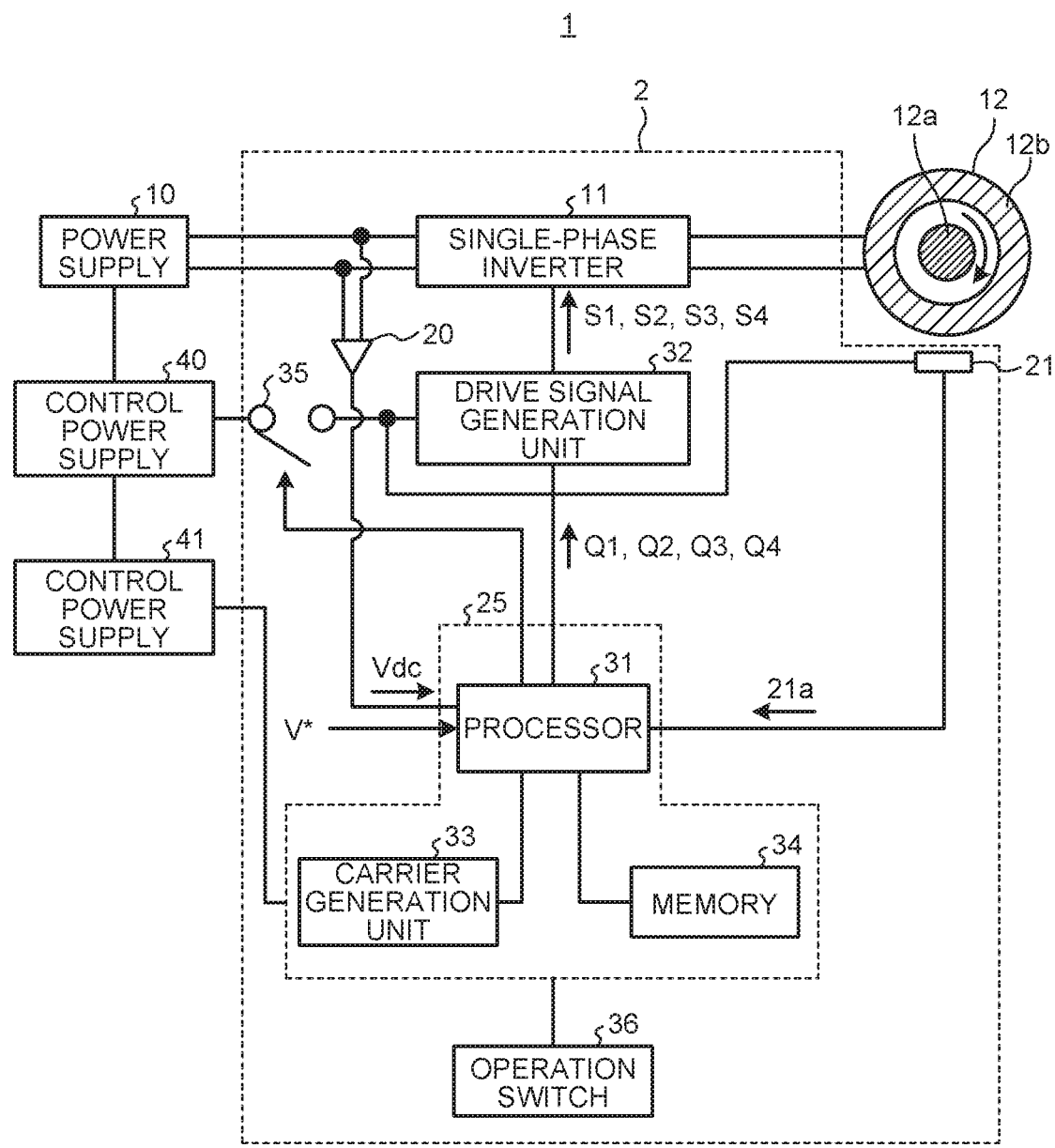
FIG. 1 is a diagram illustrating a configuration of a motor drive system including a motor drive device according to an embodiment of the present invention.

FIG. 1 is a diagram illustrating a configuration of a motor drive system including a motor drive device according to an embodiment of the present invention. A motor drive system 1 according to the embodiment of the present invention includes a power supply 10, a motor drive device 2, and a single-phase motor 12.

The power supply 10 is a direct-current power supply that supplies direct-current power to the motor drive device 2. The power supply 10 is a converter, a battery, or the like. The power supply 10 may be any power supply that outputs direct-current power, and is not limited to the converter, the battery, or the like.

The single-phase motor 12 is a brushless motor including a rotor 12a of a permanent magnet type and a stator 12b. The single-phase motor 12 may be any permanent magnet type motor that generates an induced voltage, and is not limited to the brushless motor. Four permanent magnets are arranged on the rotor 12a in a circumferential direction. These permanent magnets are arranged such that directions of magnetic poles thereof are alternately inverted in the circumferential direction, and form a plurality of magnetic poles of the rotor 12a. The number of permanent magnets is not limited to four, and is only required to be four or more. A winding (not illustrated) is wound around the stator 12b. A motor current flows through the winding. The motor current is equal to an alternating current supplied from a single-phase inverter 11 to the single-phase motor 12.

The motor drive device 2 is a device that supplies alternating-current power to the single-phase motor 12 to drive the single-phase motor 12. The motor drive device 2 includes a voltage sensor 20, a position sensor 21, the single-phase inverter 11, a control unit 25, a drive signal generation unit 32, a power supply switch 35, a control power supply 40, a control power supply 41, and an operation switch 36.

The voltage sensor 20 detects a direct-current voltage $V_{dc}$ output from the power supply 10. The voltage sensor 20 may detect a voltage applied to an input end of the motor drive device 2, or may detect a direct-current voltage applied to a wiring connected to an output end of the power supply 10.

The position sensor 21 detects a rotor rotational position, which is a rotational position of the rotor 12a, and outputs information on the detected rotational position as a position sensor signal 21a. The position sensor signal 21a is a signal that has a potential of one of two values, i.e., a high level or a low level depending on a direction of a magnetic flux generated from the rotor 12a.

The single-phase inverter 11 is a power converter having a direct-current/alternating-current conversion function of converting a direct-current voltage output from the power supply 10, into an alternating-current voltage and applying the alternating-current voltage to a motor. The alternating-current power is supplied to the single-phase motor 12.

The control unit 25 generates PWM signals Q1, Q2, Q3, and Q4 on the basis of the direct-current voltage $V_{dc}$ and the position sensor signal 21a output from the position sensor 21. Hereinafter, the PWM signals Q1, Q2, Q3, and Q4 may be simply referred to as PWM signals. The control unit 25 is a second signal generation unit.

The drive signal generation unit 32 amplifies the PWM signals output from the control unit 25 and outputs the amplified signals as drive signals S1, S2, S3, and S4 for driving switching elements in the single-phase inverter 11. The drive signal generation unit 32 is a first signal generation unit. The drive signals S1, S2, S3, and S4 are signals obtained by amplifying the PWM signals Q1, Q2, Q3, and Q4, respectively.

The control unit 25 includes a processor 31, a carrier generation unit 33, and a memory 34. The processor 31 is a processing unit that performs various calculations regarding PWM control and advance angle control. Details of the PWM control and the advance angle control will be described later. As the processor 31, a central processing unit (CPU, also referred to as a central processing device, a processing device, an arithmetic device, a microprocessor, a microcomputer, a processor, or a digital signal processor (DSP)), or system large scale integration (LSI) can be exemplified.

As the memory 34, a nonvolatile or volatile semiconductor memory such as a random access memory (RAM), a read only memory (ROM), a flash memory, an erasable programmable read only memory (EPROM), or an electrically erasable programmable read-only memory (EEPROM (registered trademark)) can be exemplified. The memory 34 is not limited thereto, and may be a magnetic disk, an optical disk, a compact disc, a mini disk, or a digital versatile disc (DVD). The memory 34 stores a program read by the processor 31. The memory 34 is used as a work area when the processor 31 performs an arithmetic process. A function of the carrier generation unit 33 illustrated in FIG. 1 may be implemented by a processor that executes a dedicated program stored in the memory 34, or may be implemented by dedicated hardware. Details of a configuration of the carrier generation unit 33 will be described later.

Figure 2:
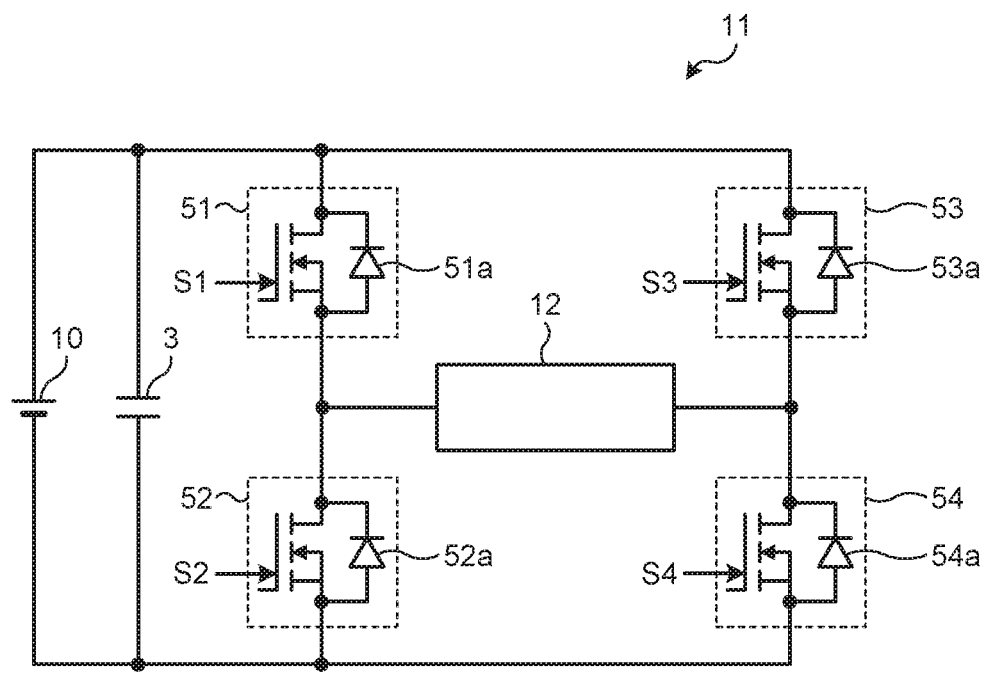
FIG. 2 is a diagram illustrating a circuit configuration of a single-phase inverter illustrated in FIG. 1.

FIG. 2 is a diagram illustrating a circuit configuration of the single-phase inverter illustrated in FIG. 1. The single-phase inverter 11 includes a plurality of switching elements 51, 52, 53, and 54 bridge-connected to one another. In addition to the plurality of switching elements 51, 52, 53, and 54 of the single-phase inverter 11, FIG. 2 illustrates the single-phase motor 12 connected to the single-phase inverter 11. Each of the two switching elements 51 and 53 located on a high-potential side is referred to as an upper-arm switching element. Each of the two switching elements 52 and 54 located on a low-potential side is referred to as a lower-arm switching element.

The switching element 51 has a connection end 11-1 connected to the switching element 52. The switching element 53 has a connection end 11-2 connected to the switching element 54. The connection ends 11-1 and 11-2 define alternating-current ends in a bridge circuit. The single-phase motor 12 is connected to the connection ends 11-1 and 11-2.

A body diode 51a connected in parallel between a drain and a source of the switching element 51 is formed in the switching element 51. A body diode 52a connected in parallel between a drain and a source of the switching element 52 is formed in the switching element 52. A body diode 53a connected in parallel between a drain and a source of the switching element 53 is formed in the switching element 53. A body diode 54a connected in parallel between a drain and a source of the switching element 54 is formed in the switching element 54. Each of the body diodes 51a, 52a, 53a, and 54a is a parasitic diode formed inside a MOSFET and is used as a freewheeling diode.

Each of the plurality of switching elements 51, 52, 53, and 54 is, for example, a MOSFET formed of a silicon-based material. However, each of the plurality of switching elements 51, 52, 53, and 54 is not limited to the MOSFET formed of a silicon-based material, and at least one of the plurality of switching elements 51, 52, 53, and 54 may be a MOSFET formed of a wide band gap semiconductor such as silicon carbide, a gallium nitride-based material, or diamond.

In general, wide band gap semiconductors have higher withstand voltage and heat resistance than silicon semiconductors. Thus, using a wide band gap semiconductor in at least one of the plurality of switching elements 51, 52, 53, and 54 increases the withstand voltage and the allowable current density of the switching elements 51, 52, 53, and 54, which makes it possible to reduce the size of a semiconductor module incorporating the switching elements 51, 52, 53, and 54 therein. Since wide band gap semiconductors also have high heat resistance, it is possible to reduce the size of a heat dissipation unit for dissipating heat generated in a semiconductor module, and also to simplify a heat dissipation structure for dissipating the heat generated in the semiconductor module.

Figure 3:
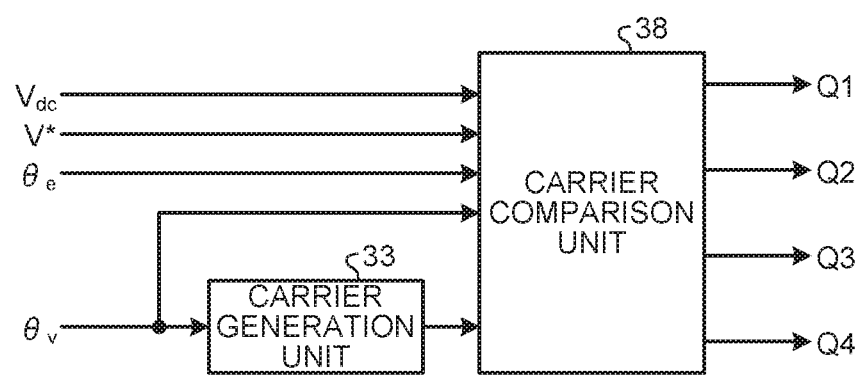
FIG. 3 is a diagram illustrating a functional configuration for generating pulse width modulation (PWM) signals illustrated in FIG. 1.
Figure 4:
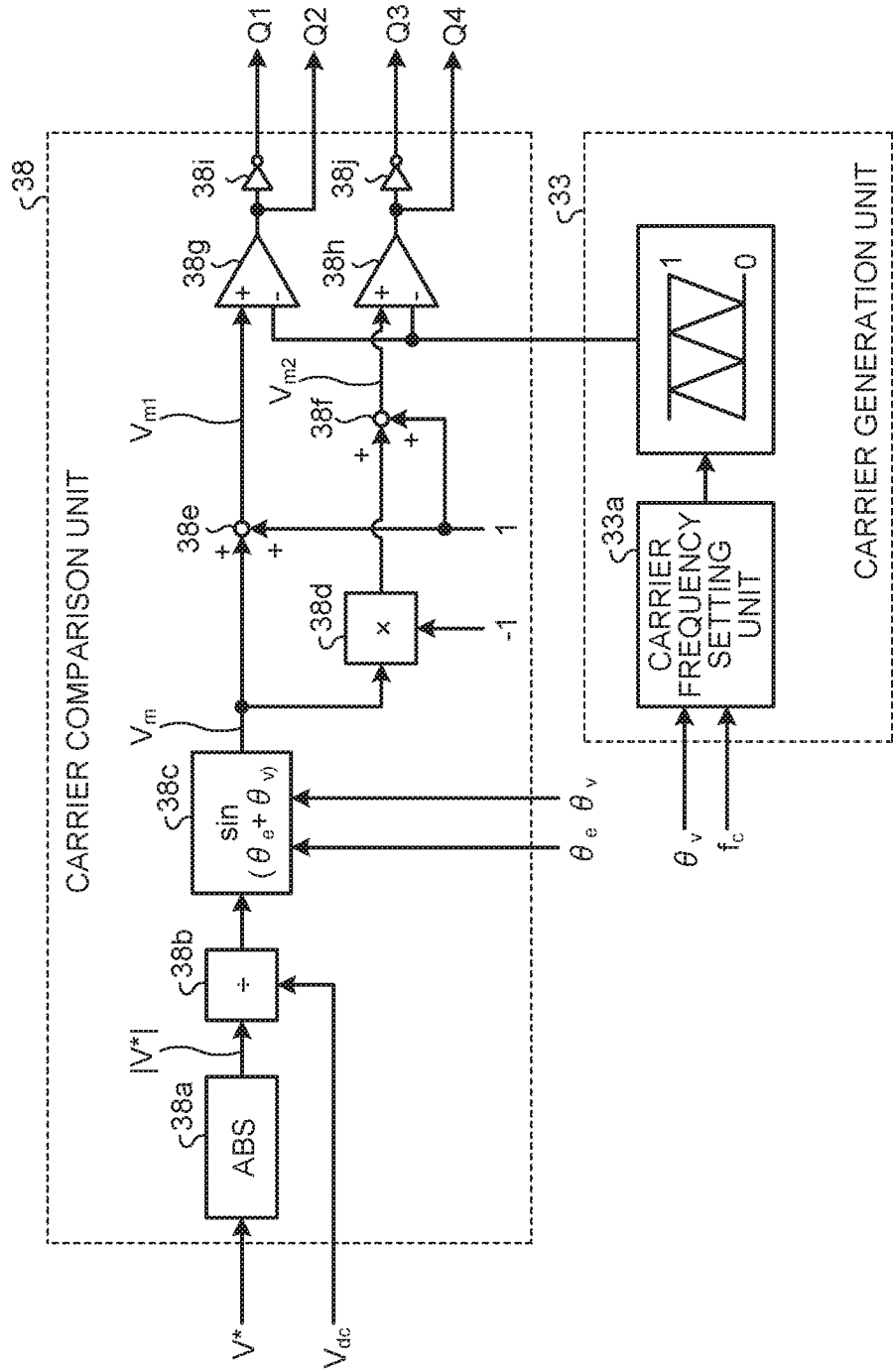
FIG. 4 is a diagram illustrating in detail a carrier comparison unit and a carrier generation unit illustrated in FIG. 3.

FIG. 3 is a diagram illustrating a functional configuration for generating the PWM signals illustrated in FIG. 1. FIG. 4 is a diagram illustrating in detail the carrier comparison unit and the carrier generation unit illustrated in FIG. 3. A function of generating the PWM signals Q1, Q2, Q3, and Q4 can be implemented by the carrier generation unit 33 and the carrier comparison unit 38 illustrated in FIG. 3. The function of the carrier comparison unit 38 is implemented by the processor 31 illustrated in FIG. 1. The carrier comparison unit 38 receives inputs of an advance phase $\theta_v$, a reference phase $\theta_e$, a carrier generated by the carrier generation unit 33, the direct-current voltage $V_{dc}$, and a voltage amplitude command V* which is an amplitude value of a voltage command $V_m$. The carrier comparison unit 38 generates PWM signals on the basis of the advance phase $\theta_v$, the reference phase $\theta_e$, the carrier, the direct-current voltage $V_{dc}$, and the voltage amplitude command V*.

The advance phase $\theta_v$ and the reference phase $\theta_e$ are used to generate voltage commands $V_{m1}$ and $V_{m2}$ illustrated in FIG. 4. The advance phase $\theta_v$ is calculated by an advance phase calculation unit described later. The "advance phase" is a phase that represents an advance angle $\theta_{vv}$ which is an advanced angle of a voltage command. The "advanced angle" is a phase difference between a motor applied voltage and a motor induced voltage. The motor applied voltage is a voltage applied to a stator winding (not illustrated) by the single-phase inverter 11. The motor induced voltage is a voltage induced in the stator winding. The motor applied voltage is synonymous with an inverter output voltage which is an output voltage of the single-phase inverter 11. When the motor applied voltage advances relative to the motor induced voltage, the "advanced angle" takes a positive value. The reference phase $\theta_e$ is calculated by a rotation speed calculation unit described later. The reference phase $\theta_e$ is a phase obtained by converting a rotor mechanical angle, which is an angle from a reference position of the rotor 12a, into an electrical angle.

As illustrated in FIG. 4, the carrier generation unit 33 includes a carrier frequency setting unit 33a. A carrier frequency $f_c$ [Hz], which is a frequency of a carrier, is set in the carrier frequency setting unit 33a. The carrier frequency setting unit 33a generates a carrier synchronized with a cycle of the advance phase $\theta_v$. The generated carrier is output to the carrier comparison unit 38. FIG. 4 illustrates a waveform of a triangular wave which is an example of the carrier. The triangular wave is a signal wave whose peak value is "1" and whose valley value is "0". The PWM control on the single-phase inverter 11 includes synchronous PWM control and asynchronous PWM control. In the case of the asynchronous PWM control, it is not necessary to synchronize the carrier with the advance phase $\theta_v$.

The carrier comparison unit 38 includes an absolute value calculation unit 38a, a division unit 38b, a multiplication unit 38c, a multiplication unit 38d, an addition unit 38e, an addition unit 38f, a comparison unit 38g, a comparison unit 38h, an output inversion unit 38i, and an output inversion unit 38j.

The absolute value calculation unit 38a calculates an absolute value |V*| of the voltage amplitude command V*. The division unit 38b divides the absolute value |V*| by the direct-current voltage $V_{dc}$. The power supply 10 is, for example, a battery in which case even when a battery voltage decreases, the division of the absolute value |V*| by the direct-current voltage $V_{dc}$ can increase a modulation rate in such a manner as to prevent the motor applied voltage from decreasing due to that battery voltage decrease, as compared with a case where the battery voltage decreases and the division by the direct-current voltage $V_{dc}$ is not performed. The battery voltage means an output voltage of the battery.

When the power supply 10 is not a battery but a power conversion device that converts alternating-current power from a commercial power supply into direct-current power, a change in an output voltage of the power conversion device is smaller than a change in an output voltage of the battery because a change in a voltage of the commercial power supply is small. Thus, where the power supply 10 that outputs direct-current power, using a commercial power supply is connected to the single-phase inverter 11, a voltage generated inside the motor drive device 2, that is, a direct-current voltage whose voltage indicates a constant value may be input to the division unit 38b instead of the direct-current voltage $V_{dc}$ being input to the division unit 38b.

The multiplication unit 38c adds the advance phase $\theta_v$ to the reference phase $\theta_e$, and calculates a sine of a result of the addition. The multiplication unit 38c calculates the voltage command $V_m$ by multiplying the calculated sine by an output of the division unit 38b.

The addition unit 38e adds 1 to the voltage command $V_m$ which is an output of the multiplication unit 38c. An output of the addition unit 38e is input to the comparison unit 38g as the voltage command $V_{m1}$ for driving the two switching elements 51 and 52 illustrated in FIG. 2. The voltage command $V_{m1}$ and the carrier are input to the comparison unit 38g. The comparison unit 38g compares the voltage command $V_{m1}$ with the carrier, thereby providing the comparison result that is the PWM signal Q2.

The output inversion unit 38i inverts an output of the comparison unit 38g. An output of the output inversion unit 38i is the PWM signal Q1. The output inversion unit 38i prevents the switching elements 51 and 52 from being turned on at the same time.

The multiplication unit 38d multiplies, by −1, the voltage command $V_m$ which is the output of the multiplication unit 38c. The addition unit 38f adds 1 to an output of the multiplication unit 38d. An output of the addition unit 38f is input to the comparison unit 38h as the voltage command $V_{m2}$ for driving the two switching elements 53 and 54 illustrated in FIG. 2. The voltage command $V_{m2}$ and the carrier are input to the comparison unit 38h. The comparison unit 38h compares the voltage command $V_{m2}$ with the carrier, thereby providing the comparison result that is the PWM signal Q4.

The output inversion unit 38j inverts an output of the comparison unit 38h. An output of the output inversion unit 38j is the PWM signal Q3. The output inversion unit 38j prevents the switching elements 53 and 54 from being turned on at the same time.

Figure 5:
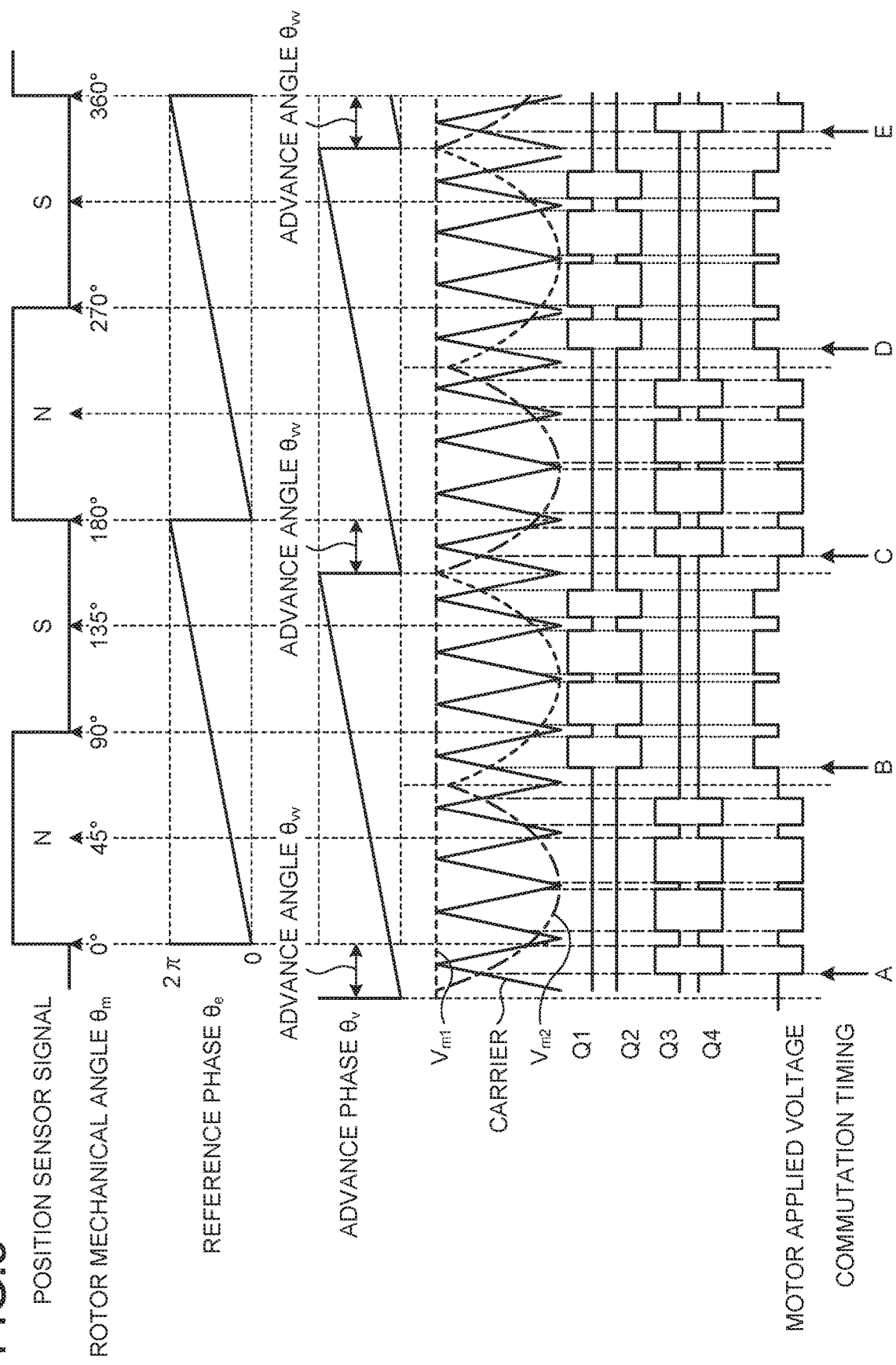
FIG. 5 is a time chart illustrating waveforms of voltage commands and the PWM signals illustrated in FIG. 4, and a motor applied voltage.

FIG. 5 is a time chart illustrating waveforms of the voltage commands and the PWM signals illustrated in FIG. 4, and the motor applied voltage. FIG. 5 illustrates waveforms of the position sensor signal, a rotor mechanical angle $\theta_m$, the reference phase $\theta_e$, the advance phase $\theta_v$, the voltage commands $V_{m1}$ and $V_{m2}$, the carrier, the PWM signals Q1, Q2, Q3, and Q4, and the motor applied voltage. The waveform of the voltage command $V_{m1}$ is indicated by a broken line. The waveform of the voltage command $V_{m2}$ is indicated by a dot-and-dash line. These waveforms are waveforms detected when the rotor 12a including four permanent magnets makes one rotation, for example. A, B, C, D, and E indicated by arrows in FIG. 5 represent timing of commutation of a current flowing through each coil wound around the stator 12b of the single-phase motor 12.

The carrier comparison unit 38 illustrated in FIG. 4 generates the PWM signals Q1, Q2, Q3 and Q4, using the voltage commands $V_{m1}$ and $V_{m2}$ having the waveforms illustrated in FIG. 5. As a result of using the PWM signals Q1, Q2, Q3, and Q4 to control the switching elements 51, 52, 53, and 54 in the single-phase inverter 11, a PWM-controlled motor applied voltage is applied to the single-phase motor 12. The motor applied voltage is a signal that takes a high level, low level, or zero level potential.

Known modulation methods used when generating the PWM signals Q1, Q2, Q3, and Q4 include a bipolar modulation method and a unipolar modulation method. The bipolar modulation method is a modulation method that outputs a voltage pulse that changes between positive and negative potentials. The unipolar modulation method is a modulation method that outputs a voltage pulse that changes among three potentials every half cycle of a power supply, that is, a voltage pulse that changes among a positive potential, a negative potential, and a zero potential.

The waveforms of the PWM signals Q1, Q2, Q3, and Q4 illustrated in FIG. 5 are obtained by the unipolar modulation. Any modulation method may be used for the motor drive device 2 according to the present embodiment. Where it is necessary to bring the waveform of the motor applied voltage and the waveform of a current flowing through each coil of the single-phase motor 12 closer to a sinusoidal wave, the unipolar modulation having a smaller harmonic content is more preferably employed than the bipolar modulation.

As described above, the motor applied voltage is determined by comparing the carrier with the voltage commands. As the number of motor rotations increases, the frequency of each voltage command increases, so that the number of voltage pulses included in the motor applied voltage output in one cycle of the electrical angle decreases. As a result, an influence of the number of voltage pulses on distortion of a current waveform increases. Generally, when the number of voltage pulses is an even number, even-order harmonics are superimposed on the motor applied voltage, and the symmetry between a positive-side waveform and a negative-side waveform disappears. Accordingly, in order to bring the waveform of the current flowing through each coil of the single-phase motor 12 closer to a sinusoidal wave in which the harmonic content is reduced, the number of voltage pulses in one cycle of the electrical angle is preferably controlled so as to be an odd number. Controlling the number of voltage pulses in one cycle of the electrical angle so as to be an odd number makes it possible to bring the waveform of the current flowing through each coil of the single-phase motor 12 closer to a sinusoidal wave.

Figure 6:
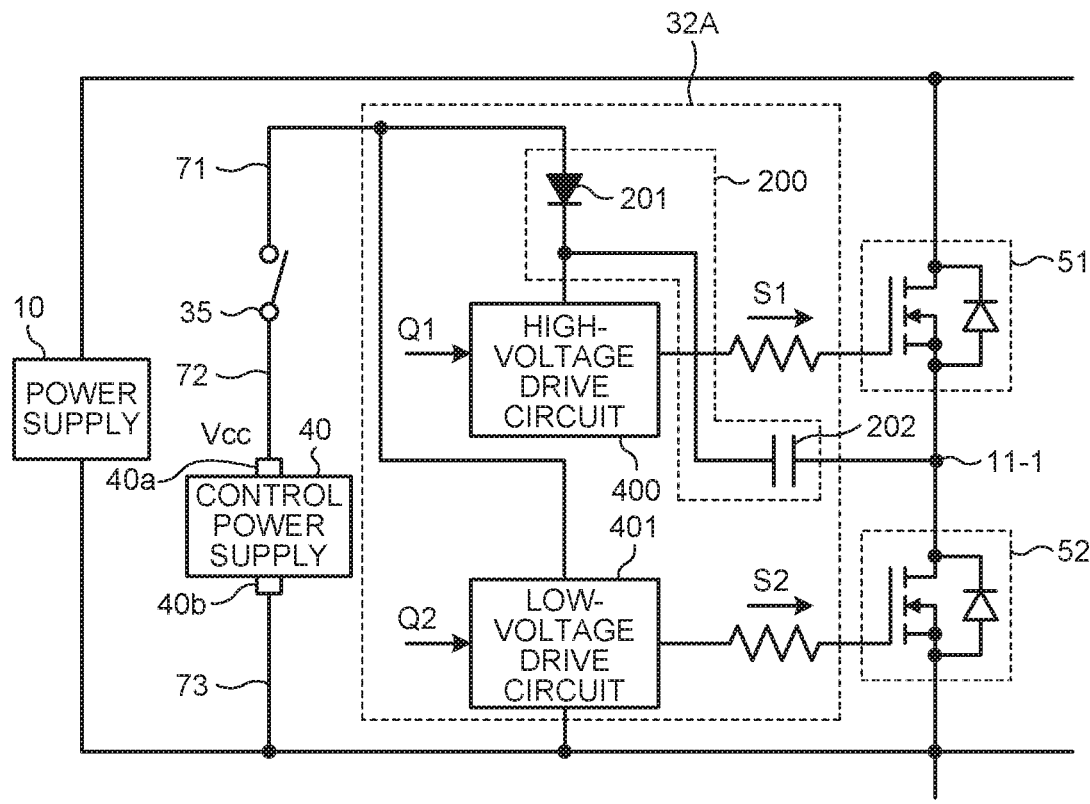
FIG. 6 is a diagram illustrating an example configuration of a signal generation circuit of a drive signal generation unit illustrated in FIG. 1.

Next, an example configuration of a circuit that generates a drive signal will be described. FIG. 6 is a diagram illustrating an example configuration of a signal generation circuit of the drive signal generation unit illustrated in FIG. 1. A signal generation circuit 32A illustrated in FIG. 6 is a circuit that generates the drive signals S1 and S2, using a voltage output from the control power supply 40. Note that FIG. 6 does not illustrate a circuit that generates the drive signals S3 and S4, but since the circuit is configured similarly to the signal generation circuit 32A illustrated in FIG. 6, a description of a configuration thereof will be omitted hereinafter.

One end of a first wiring line 71 is connected to the signal generation circuit 32A, and one end of the power supply switch 35 is connected to the other end of the first wiring line 71. The other end of the power supply switch 35 is connected to one end of a second wiring line 72, and the other end of the second wiring line 72 is connected to an output terminal 40a of the control power supply 40. One end of a third wiring line 73 is connected to an input terminal 40b of the control power supply 40, and the other end of the third wiring line 73 is electrically connected to the power supply 10.

The signal generation circuit 32A includes a bootstrap circuit 200, a high-voltage drive circuit 400, and a low-voltage drive circuit 401.

The bootstrap circuit 200 includes a boot diode 201 whose anode is connected to the control power supply 40, and a boot capacitor 202 whose one end is connected to a cathode of the boot diode 201. The other end of the boot capacitor 202 is connected to the connection end 11-1 of the switching element 51 to the switching element 52. The boot capacitor 202 functions to increase a voltage for operating the high-voltage drive circuit 400 higher than a voltage output from the control power supply 40.

For the bootstrap circuit 200 configured as described above, the boot capacitor 202 is charged through a current flowing through a path defined by the control power supply 40, the boot diode 201, the boot capacitor 202, and the switching element 52 when the switching element 52 is turned on. A capacitor voltage $V_c$ generated across the charged boot capacitor 202 can be expressed as $V_c = V_{cc} + V_{BD} - V_f$ where $V_{cc}$ represents a voltage of the control power supply 40, $V_{BD}$ represents a forward voltage of the body diode 52a, and $V_f$ represents a forward voltage of the boot diode 201.

The high-voltage drive circuit 400 uses, as a power supply voltage, a voltage output from the bootstrap circuit 200 to convert the PWM signal Q1 into the drive signal S1 and outputs the drive signal S1 to a gate of the switching element 51.

The low-voltage drive circuit 401 uses, as a power supply voltage, the voltage output from the control power supply 40 to convert the PWM signal Q2 into the drive signal S2 and outputs the drive signal S2 to a gate of the switching element 52.

Next, a description will be made as to an operation of controlling the power supply switch 35 when a stop operation is performed, thereby reducing standby power generated in the drive signal generation unit 32 and the like, and preventing the life of a capacitor 3 illustrated in FIG. 2 from being shortened by regenerative power. The capacitor 3 is an electrolytic capacitor for smoothing a voltage output from the power supply 10.

Figure 7:
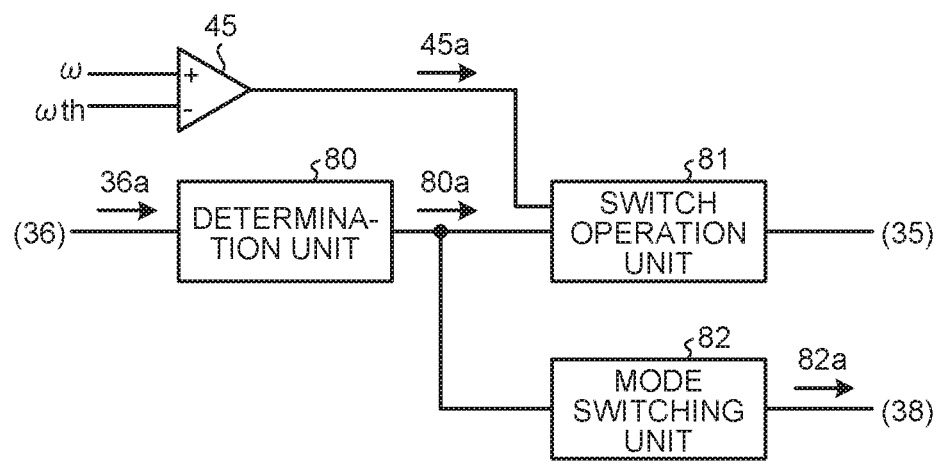
Figure 8:
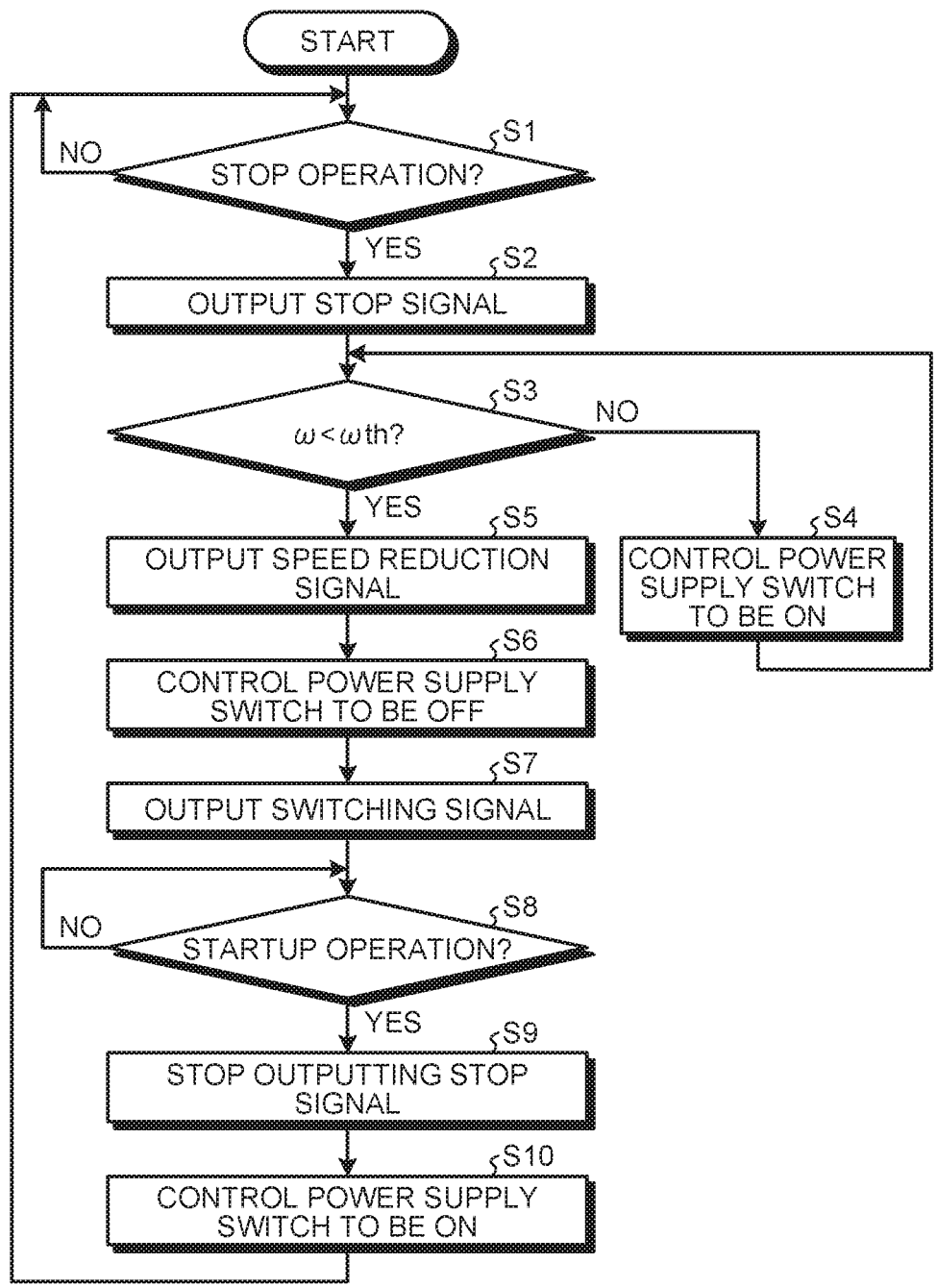
FIG. 8 is a flowchart explaining operations of a speed comparison unit, a determination unit, a switch operation unit, and a mode switching unit illustrated in FIG. 7.

FIG. 7 is a diagram illustrating an example configuration of a function of controlling an operation of the power supply switch illustrated in FIG. 1 and reducing power consumed by the drive signal generation unit and the like. FIG. 8 is a flowchart explaining operations of a speed comparison unit, a determination unit, a switch operation unit, and a mode switching unit illustrated in FIG. 7. A speed comparison unit 45, a determination unit 80, a switch operation unit 81, and a mode switching unit 82 illustrated in FIG. 7 are implemented by the processor 31 and the memory 34 illustrated in FIG. 1. That is, a computer program for executing processes of the speed comparison unit 45, the determination unit 80, the switch operation unit 81, and the mode switching unit 82 is stored in the memory 34, and then the processor 31 reads and executes the program, and thereby functions of the speed comparison unit 45, the determination unit 80, the switch operation unit 81, and the mode switching unit 82 are realized.

After the operation of the single-phase inverter 11 illustrated in FIG. 1 is started, the determination unit 80 illustrated in FIG. 7 determines whether a stop operation of the motor drive device 2 has been performed on the basis of an operation signal 36a output from the operation switch 36 (step S1). In the case of the operation signal 36a having a potential of one of two values, i.e., a high level or a low level, for example, the high-level operation signal 36a indicates that a startup operation of the motor drive device 2 has been performed, and the low-level operation signal 36a indicates that the stop operation of the motor drive device 2 has been performed.

If the determination unit 80 determines that the stop operation has not been performed because the high-level operation signal 36a has been input (step S1, No), the determination unit 80 repeats the process in step S1.

If the determination unit 80 determines that the stop operation has been performed because the high-level operation signal 36a has changed to the at the low-level operation signal 36a (step S1, Yes), the determination unit 80 outputs, to the switch operation unit 81 and the mode switching unit 82, a stop signal 80a indicating that the stop operation has been performed (step S2).

By comparing the rotation speed ω with the rotation speed threshold ωth, the speed comparison unit 45 determines whether a rotation speed ω is lower than a rotation speed threshold ωth (step S3). The rotation speed ω is calculated by the rotation speed calculation unit described later. The rotation speed threshold ωth is set to a rotation speed at which $V_{dc}=V_n$ is established where $V_{dc}$ denotes the direct-current voltage output from the power supply 10 and $V_n$ denotes the induced voltage.

If the rotation speed ω is higher than the rotation speed threshold ωth (step S3, No), the speed comparison unit 45 does not output a speed reduction signal 45a and repeats the process in step S3. An induced voltage of the motor is determined depending on the motor rotation speed, and regenerative power generated by the induced voltage is generated when $V_{dc}<V_n$ is established. When $V_{dc}<V_n$ is established and hence the regenerative power is generated, the life of the capacitor 3 may be shortened as a regenerative voltage higher than a direct-current voltage is applied to the capacitor 3 illustrated in FIG. 2. Since the rotation speed threshold ωth is set to the rotation speed at which $V_{dc}=V_n$ is established, the speed comparison unit 45 does not output the speed reduction signal 45a when $V_{dc}<V_n$ is established, that is, when the rotation speed ω is higher than the rotation speed threshold ωth.

When the speed reduction signal 45a is not output, the switch operation unit 81 controls the power supply switch 35 such that the power supply switch 35 is maintained in an ON state (step S4). For example, in a case where the power supply switch 35 is a MOSFET, the switch operation unit 81 continues to output a gate drive signal when the speed reduction signal 45a is not output. Since the MOSFET is maintained in the ON state when receiving the gate drive signal, power supply from the control power supply 40 to the drive signal generation unit 32 is continued. Consequently, the switching operation performed by the single-phase inverter 11 is continued, thereby preventing a regenerative current from flowing from the single-phase motor 12 to the power supply 10. Accordingly, a voltage higher than the direct-current voltage is not applied to the capacitor 3. Since, as described above, the present embodiment can prevent the application of a regenerative voltage higher than the direct-current voltage to the capacitor 3 without having to generate a rotating magnetic field, unlike the conventional technique, it becomes possible to prevent the shortening of the life of the capacitor 3.

If the rotation speed ω is lower than the rotation speed threshold ωth (step S3, Yes), the speed comparison unit 45 outputs the speed reduction signal 45a (step S5). When the speed reduction signal 45a is output, the switch operation unit 81 controls the power supply switch 35 such that the power supply switch 35 is changed from the ON state to an OFF state (step S6). For example, in the case where the power supply switch 35 is a MOSFET, the switch operation unit 81 stops outputting the gate drive signal when receiving the speed reduction signal 45a. Consequently, the MOSFET is turned off, thereby stopping the power supply from the control power supply 40 to the drive signal generation unit 32. When the power supply switch 35 is turned off, power supply from the power supply switch 35 to the position sensor 21 is also stopped. Because the power supply from the control power supply 40 to the drive signal generation unit 32 is stopped, the drive signals S1, S2, S3, and S4 are no longer output from the drive signal generation unit 32. Therefore, the switching operation in the single-phase inverter 11 is stopped. Although the switching operation is stopped as described above, a regenerative voltage lower than the direct-current voltage is applied to the capacitor 3 when the rotation speed ω is lower than the rotation speed threshold ωth. Accordingly, even when the power supply switch 35 is turned on, the regeneration voltage lower than the direct-current voltage is applied to the capacitor 3, which makes it possible to prevent the shortening of the life of the capacitor 3.

In a case where the power supply switch 35 is a mechanical normally closed switch, after receiving the stop signal 80a, the switch operation unit 81 keeps applying a voltage to an exciting coil for driving a movable contact of the power supply switch 35, until the switch operation unit 81 receives the speed reduction signal 45a. During the application of the voltage to the exciting coil, the movable contact of the power supply switch 35 keeps contacting a fixed contact. Consequently, the power supply from the control power supply 40 to the drive signal generation unit 32 is continued. When the switch operation unit 81 receives the speed reduction signal 45a after receiving the stop signal 80a, the switch operation unit 81 stops applying the voltage to the exciting coil. Consequently, the power supply switch 35 becomes the OFF state as the movable contact of the power supply switch 35 moves away from the fixed contact, such that the power supply from the control power supply 40 to the drive signal generation unit 32 is stopped.

In addition, since the power supply from the control power supply 40 to the drive signal generation unit 32 is stopped, a current no longer flows through the signal generation circuit 32A that constitutes the drive signal generation unit 32. As a result, the standby power generated in the drive signal generation unit 32 can be reduced as compared with a case of continuing the power supply from the control power supply 40 to the drive signal generation unit 32. Furthermore, since the power supply from the control power supply 40 to the position sensor 21 is stopped, a current no longer flows through the position sensor 21. As a result, the standby power generated in the position sensor 21 can be reduced as compared with a case of continuing the power supply from the control power supply 40 to the position sensor 21.

The mode switching unit 82 that has received the stop signal 80a outputs a switching signal 82a to the carrier comparison unit 38 (step S7). The switching signal 82a is a signal for performing switching from a first mode that is a normal mode to a second mode that is a low power consumption mode. The first mode is an operation pattern that causes the carrier comparison unit 38 illustrated in FIG. 4 to generate a carrier signal. The second mode is an operation pattern that causes the carrier comparison unit 38 to stop generating the carrier signal. For example, the carrier comparison unit 38 continues to generate the carrier signal until the switching signal 82a is input from the mode switching unit 82, and stops generating the carrier signal after the switching signal 82a is input from the mode switching unit 82. Since the generation of the carrier signal is stopped, the power consumed by the carrier comparison unit 38 during the stop of the single-phase inverter 11 is reduced.

After the operation of the single-phase inverter 11 is stopped, the determination unit 80 determines whether the startup operation has been performed on the basis of the operation signal 36a output from the operation switch 36 (step S8).

If the determination unit 80 determines that the startup operation has not been performed because the low-level operation signal 36a has been input (step S8, No), the determination unit 80 repeats the process in step S8.

If the determination unit 80 determines that the startup operation has been performed because the low-level operation signal 36a has changed to the high-level operation signal 36a (step S8, Yes), the determination unit 80 stops outputting the stop signal 80a (step S9).

Since the output of the stop signal 80a is stopped, the switch operation unit 81 controls the power supply switch 35 such that the power supply switch 35 is changed from the OFF state to the ON state (step S10). After step S10, the determination unit 80 performs the process in step S1.

For example, in a case where the power supply switch 35 is a MOSFET, the switch operation unit 81 outputs a gate drive signal when the output of the stop signal 80a is stopped. Consequently, the MOSFET is turned on to thereby restart the power supply from the control power supply 40 to the drive signal generation unit 32. For example, in a case where the power supply switch 35 is a mechanical normally closed switch, the switch operation unit 81 applies a voltage to the exciting coil for driving the movable contact of the power supply switch 35 when the output of the stop signal 80a is stopped. Consequently, the power supply switch 35 becomes the ON state as the movable contact of the power supply switch 35 comes into contact with the fixed contact, such that the power supply from the control power supply 40 to the drive signal generation unit 32 is restarted.

Since the power supply from the control power supply 40 to the drive signal generation unit 32 is restarted, the drive signal generation unit 32 generates the drive signals S1, S2, S3, and S4, such that the single-phase inverter 11 performs power conversion. Consequently, the single-phase motor 12 starts rotating. When the power supply switch 35 is turned on, the power supply from the power supply switch 35 to the position sensor 21 is also restarted, so that the position sensor 21 can generate the position sensor signal 21a.

Figure 9:
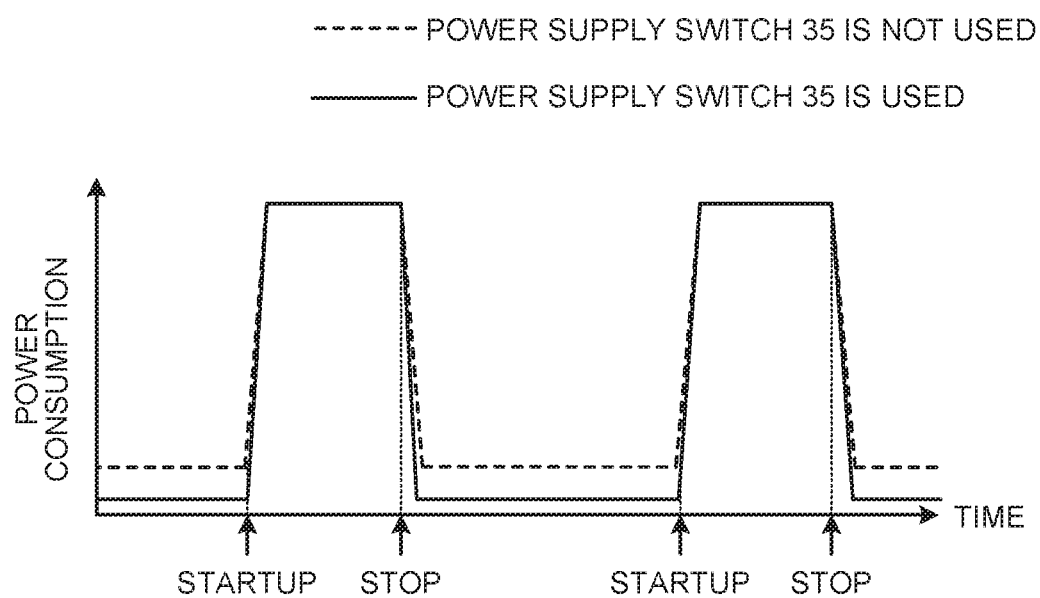
FIG. 9 is a diagram illustrating changes in power consumed by the drive signal generation unit and a position sensor illustrated in FIG. 1.

FIG. 9 is a diagram illustrating changes in power consumed by the drive signal generation unit and the position sensor illustrated in FIG. 1. The vertical axis in FIG. 9 represents a total value of the power consumed by the drive signal generation unit 32 and the position sensor 21 illustrated in FIG. 1, for example. The horizontal axis therein represents time. A solid line in FIG. 9 represents power consumption occurring in the drive signal generation unit 32 and the position sensor 21 when the power supply switch 35 illustrated in FIG. 1 is used. A broken line in FIG. 9 represents the power consumption occurring in the drive signal generation unit 32 and the position sensor 21 when the power supply switch 35 is not used.

In the case of using the power supply switch 35, the power consumed by the drive signal generation unit 32 and the position sensor 21 indicates a lower value because the power supply switch 35 becomes the OFF state than in the case of not using the power supply switch 35. As described above, the motor drive device 2 according to the present embodiment can provide the reduced standby power in the drive signal generation unit 32 that is an inverter control unit and the position sensor 21 during the stop of the single-phase inverter 11.

Although the motor drive device 2 according to the present embodiment is configured to stop the power supply to the drive signal generation unit 32 and the position sensor 21, the motor drive device 2 may be configured to stop the power supplied to the drive signal generation unit 32 or the position sensor 21. For example, the motor drive device 2 is preferably configured so that the power supplied to the drive signal generation unit 32 is stopped when the standby power of the drive signal generation unit 32 is larger than the standby power of the position sensor 21.

In the motor drive device 2 according to the present embodiment, the normal mode is switched to the low power consumption mode while the single-phase inverter 11 is stopped. Therefore, the power consumption occurring in the carrier comparison unit 38 is reduced, thereby further reducing the entire power consumption in the motor drive device 2. In a case where the power supply 10 is, for example, a battery, the standby power is reduced as the power consumption is reduced, such that discharge from the battery is reduced during the stop of the single-phase inverter 11. As a result, operating time of the single-phase motor 12 can be prolonged. Furthermore, heat generation in circuit components such as an electrolytic capacitor and a resistor that constitute the drive signal generation unit 32 is reduced due to the reduction in the standby power, so that the life of the circuit components can be extended.

In some case, a change in temperature of the resistor changes shifts a timing at which to generate the drive signals S1, S2, S3, and S4 each of which drives a corresponding one of the plurality of switching elements. In the motor drive device 2 according to the present embodiment, no power is supplied to the drive signal generation unit 32 while the single-phase inverter 11 is stopped. As a result, heat generation in circuit components such as a resistor is reduced to thereby reduce the shift in the generation timing for the drive signals S1, S2, S3, and S4 at a time of starting the single-phase inverter 11, which can result in improvement of the accuracy of inverter control.

For some conventional motor drive devices, a switch is provided between a direct-current power supply and an inverter. When turned off, the switch cuts off supply of power from the direct-current power supply to the inverter and an inverter control means to thereby reduce standby power. When the switch changes from an OFF state to an ON state, an inrush current flows from the direct-current power supply to the inverter having an electrolytic capacitor mounted thereon. Unfortunately, such an inrush current causes a high voltage to be applied to the electrolytic capacitor, thereby shortening the life of the electrolytic capacitor. Thus, a circuit for controlling the inrush current is required of the inverter, which results in a complicated structure of the inverter and an increase in manufacturing cost of the inverter. On the other hand, in the motor drive device 2 according to the present embodiment, the single-phase inverter 11 is connected to the power supply 10 without using the switch. Therefore, no inrush current is generated and the life of the electrolytic capacitor can be extended.

Figure 10:
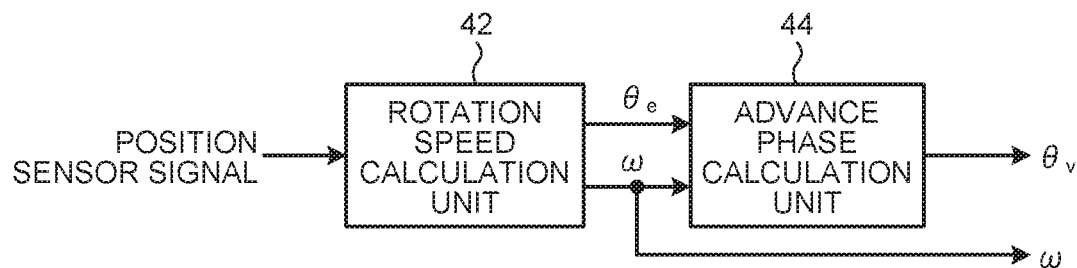
FIG. 10 is a diagram illustrating a functional configuration for calculating an advance phase input to the carrier generation unit and the carrier comparison unit illustrated in FIGS. 3 and 4.

Next, the advance angle control in the present embodiment will be described. FIG. 10 is a diagram illustrating a functional configuration for calculating an advance phase input to the carrier generation unit and the carrier comparison unit illustrated in FIGS. 3 and 4. A function of each of a rotation speed calculation unit 42 and an advance phase calculation unit 44 illustrated in FIG. 10 is implemented by the processor 31 and the memory 34 illustrated in FIG. 1. That is, a computer program for executing processes of the rotation speed calculation unit 42 and the advance phase calculation unit 44 is stored in the memory 34, and then the processor 31 reads and executes the program, and thereby the functions of the rotation speed calculation unit 42 and the advance phase calculation unit 44 are realized.

The rotation speed calculation unit 42 calculates the rotation speed ω and the reference phase $\theta_e$ of the single-phase motor 12 on the basis of the position sensor signal 21a. The reference phase $\theta_e$ is a phase obtained by converting the rotor mechanical angle $\theta_m$, which is a rotation angle of the rotor 12a from the reference position, into an electrical angle. The advance phase calculation unit 44 calculates the advance phase $\theta_v$ on the basis of the rotation speed ω and the reference phase $\theta_e$ calculated by the rotation speed calculation unit 42.

Figure 11:
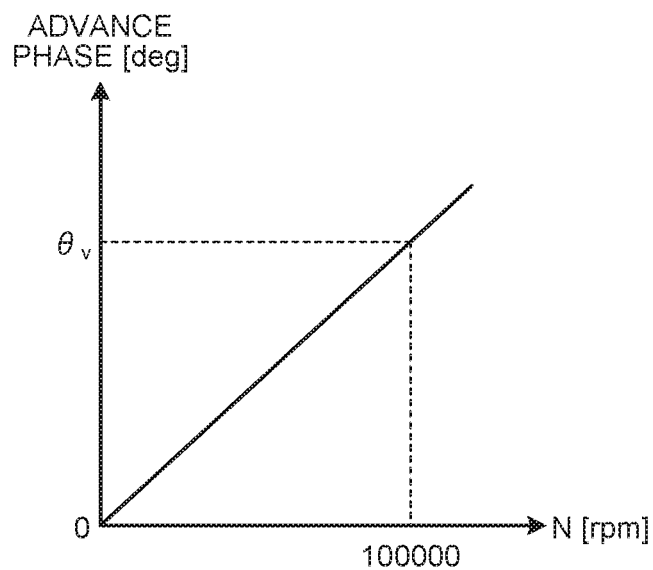
FIG. 11 is a diagram illustrating an example of a method of calculating the advance phase illustrated in FIG. 10.

FIG. 11 is a diagram illustrating an example of a method of calculating the advance phase illustrated in FIG. 10. The horizontal axis in FIG. 11 represents the number of motor rotations N, and the vertical axis in FIG. 11 represents the advance phase $\theta_v$. The number of motor rotations N is the number of rotations per unit time and corresponds to a rotation speed. As illustrated in FIG. 11, the advance phase $\theta_v$ can be determined using a function in which the advance phase $\theta_v$ increases as the number of motor rotations N increases. Although the example in FIG. 11 provides the advance phase $\theta_v$ determined by a first order linear function, the function determining the advance phase $\theta_v$ is not limited thereto. Any function other than the first order linear function may be used as long as the advance phase $\theta_v$ becomes the same or large in correspondence to the increase in the number of motor rotations N.

A general electric blower is controlled such that the number of rotations is constant. For such a constant rotation number control, an overcurrent may flow through a motor. The reason why the overcurrent flows is that a current changes rapidly in an attempt to keep the number of motor rotations constant when a load changes. More specifically, when the control rotation number control is performed at a time of transition from a "light load state", i.e., a "small load torque state" to a "heavy load state", i.e., a "large load torque state", a motor output torque needs to be increased in an attempt to keep the number of rotations unchanged, which results in an increased amount of change in a motor current.

The present embodiment provides control performed so that the voltage amplitude command V* is constant during steady operation. Since the voltage amplitude command V* is constant, the voltage amplitude command V* is not changed when a load increases. As a result, the number of motor rotations decreases in correspondence to an increase in a load torque. This control prevents an abrupt change in the motor current and an overcurrent, thereby achieving an electric blower and an electric vacuum cleaner that rotate stably.

In a case of the electric blower, the load torque increases due to an increase in the number of rotations of blades that are a load of the motor, and also increases due to an increase in the diameter of an air passage. The diameter of the air passage indicates, for example, a size of a suction port of an electric vacuum cleaner.

For example, when the diameter of the air passage is large because nothing is in contact with the suction port, a force for sucking the wind is required. Accordingly, the load torque increases under the condition where the blades rotate at the same number of rotations. On the other hand, when the suction port is closed by something in contact with the suction port, the diameter of the air passage is narrowed and the force for sucking the wind is not necessary. Therefore, the load torque decreases under the condition where the blades rotate at the same number of rotations.

Next, an effect of the advance angle control will be described. Increasing the advance phase $\theta_v$ in correspondence to an increase in the number of rotations can widen a range of the number of rotations. When the advance phase $\theta_v$ is set to "0", the number of rotations is saturated at a point where the motor applied voltage is equal to the motor induced voltage. In order to further increase the number of rotations, the advance phase $\theta_v$ is advanced to weaken a magnetic flux generated in the stator due to an armature reaction, thereby reducing an increase in the motor induced voltage and thus increasing the number of rotations. Accordingly, a wide region of the number of rotations can be obtained by selecting the advance phase $\theta_v$ in correspondence to the number of rotations.

In applying the advance angle control according to the present embodiment to the electric vacuum cleaner, a voltage command is kept constant regardless of a change in a closed state of the suction port, that is, regardless of the load torque, and the advance phase $\theta_v$ which is an advanced angle of the voltage command is increased in correspondence to an increase in the rotation speed. With such control, stable driving is possible in a wide rotation speed range.

Figure 12:
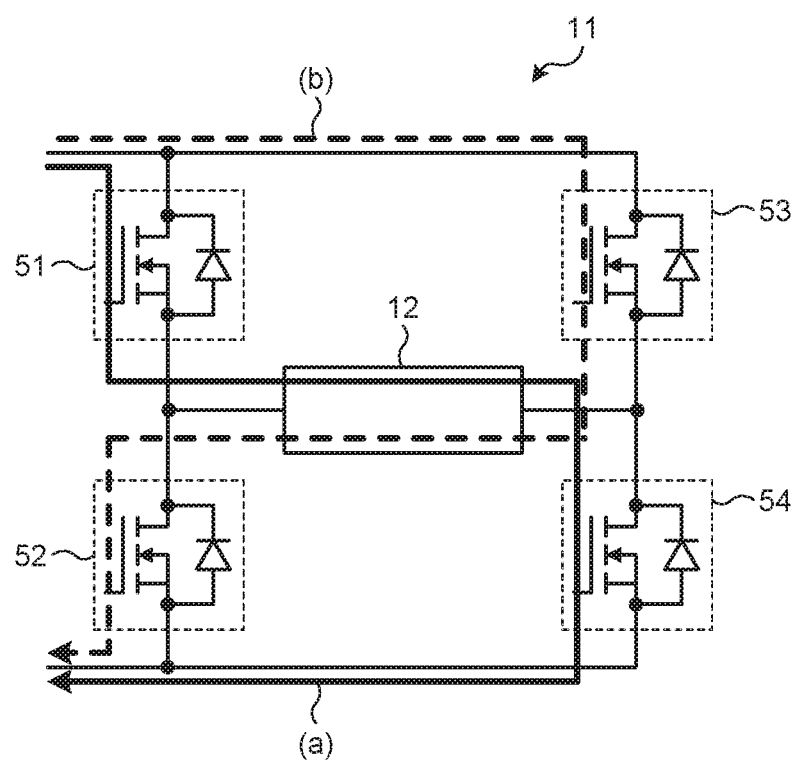
FIG. 12 is a first diagram illustrating a path of a motor current depending on the polarity of an inverter output voltage.
Figure 13:
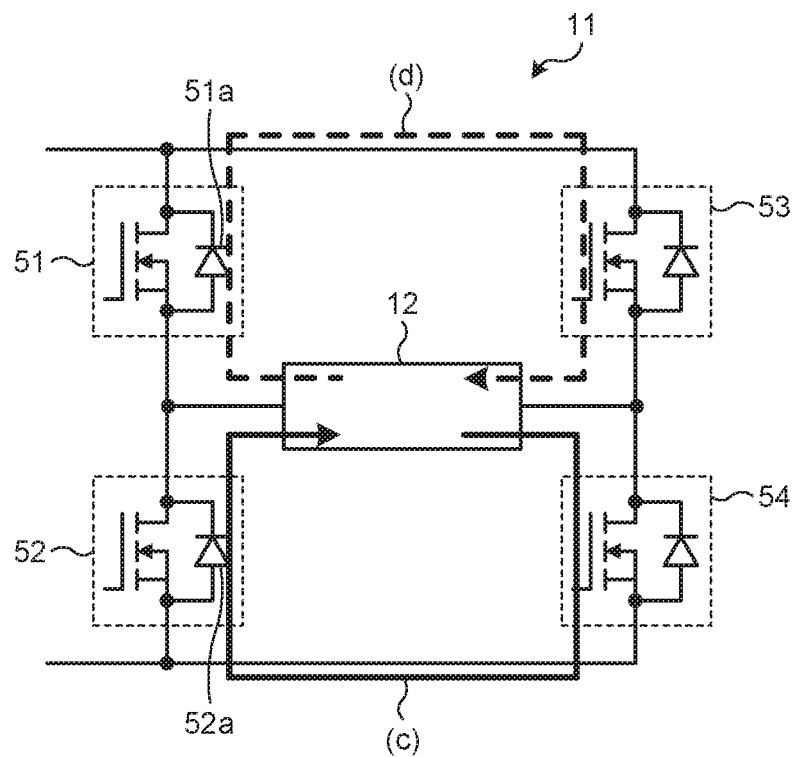
FIG. 13 is a second diagram illustrating the path of the motor current depending on the polarity of the inverter output voltage.
Figure 14:
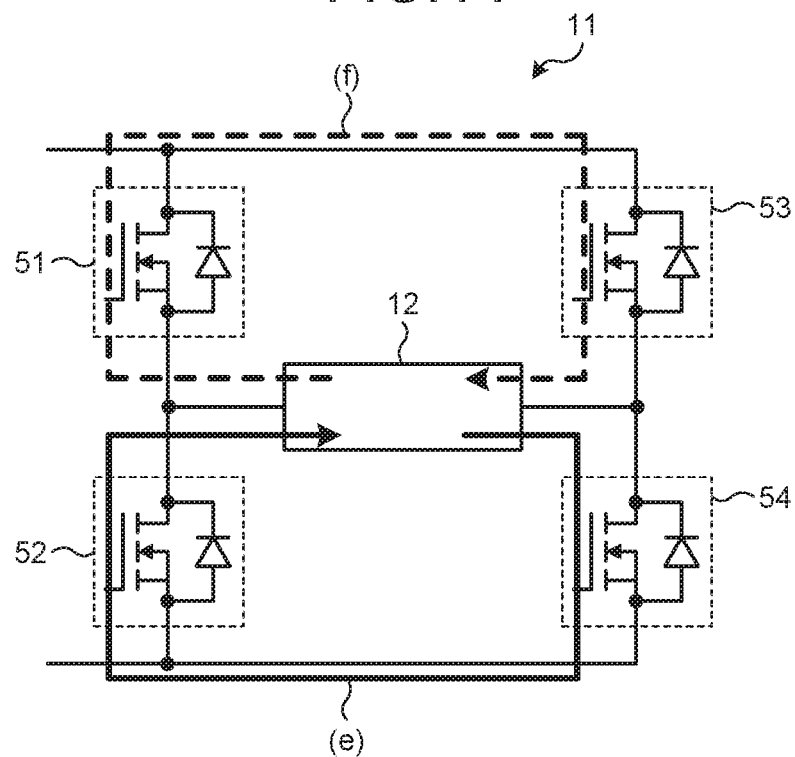
FIG. 14 is a third diagram illustrating the path of the motor current depending on the polarity of the inverter output voltage.
Figure 15:
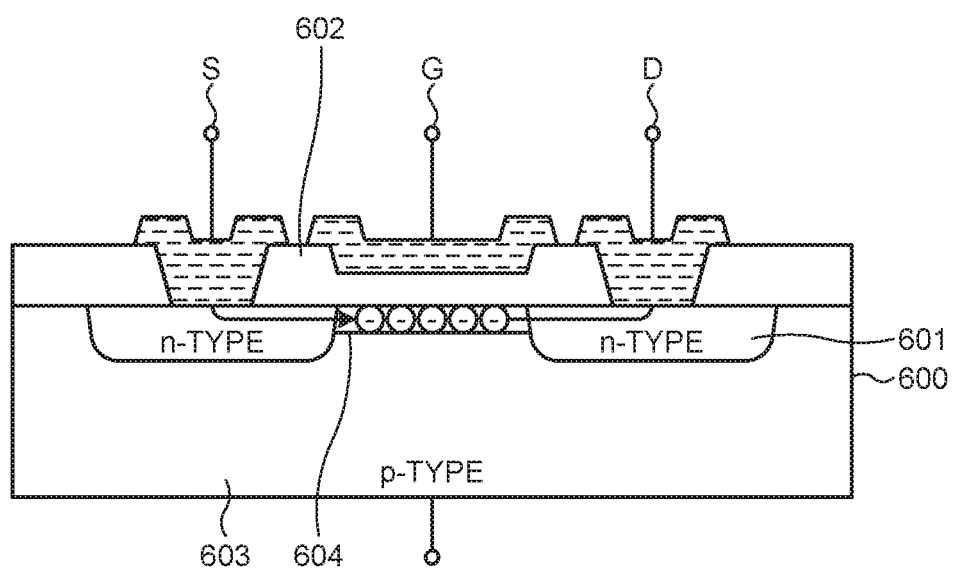
FIG. 15 is a schematic cross-sectional view illustrating a schematic structure of a metal-oxide-semiconductor field-effect transistor (MOSFET) that can be used as switching elements illustrated in FIG. 2.

Next, a loss reduction method in the present embodiment will be described with reference to FIGS. 12 to 15. FIG. 12 is a first diagram illustrating a path of a motor current depending on the polarity of the inverter output voltage. FIG. 13 is a second diagram illustrating the path of the motor current depending on the polarity of the inverter output voltage. FIG. 14 is a third diagram illustrating the path of the motor current depending on the polarity of the inverter output voltage. FIG. 15 is a schematic cross-sectional view illustrating a schematic structure of a MOSFET that can be used as the switching elements illustrated in FIG. 2. First, the schematic structure of the MOSFET will be described with reference to FIG. 15, and then the path of the motor current will be described with reference to FIGS. 12 to 14.

FIG. 15 illustrates an n-type MOSFET. In a case of the n-type MOSFET, a p-type semiconductor substrate 600 is used as illustrated in FIG. 15. A source electrode S, a drain electrode D, and a gate electrode G are formed on the semiconductor substrate 600. A high-concentration impurity is ion-implanted to form a region 601 of n-type at each of portions in contact with the source electrode S and the drain electrode D. In addition, the semiconductor substrate 600 has an oxide insulating film 602 formed thereon between the gate electrode G and a portion where the region 601 of n-type is not formed. That is, the oxide insulating film 602 is interposed between the gate electrode G and a region 603 of p-type in the semiconductor substrate 600.

When a positive voltage is applied to the gate electrode G, electrons are attracted to a boundary surface between the region 603 of p-type in the semiconductor substrate 600 and the oxide insulating film 602, such that the boundary surface is negatively charged. In a portion where the electrons are gathered, the electron density becomes higher than the hole density, such that the portion is changed into an n-type portion. The n-type portion serves as a path for a current and is called a channel 604. The channel 604 is an n-type channel in the example in FIG. 15. The MOSFET is controlled such that the MOSFET is turned on, thereby allowing more current to flow through the channel 604 than through a body diode formed in the region 603 of p-type.

When the polarity of the inverter output voltage is positive, as indicated by thick solid line (a) in FIG. 12, the current flows into the single-phase motor 12 through a channel of the switching element 51 which is an upper arm of a first phase, and flows out of the single-phase motor 12 and through a channel of the switching element 54 which is a lower arm of a second phase. When the polarity of the inverter output voltage is negative, as indicated by thick broken line (b) in FIG. 12, the current flows into the single-phase motor 12 through a channel of the switching element 53 which is an upper arm of the second phase, and flows out of the single-phase motor 12 and through a channel of the switching element 52 which is a lower arm of the first phase.

Next, a current path when the inverter output voltage is zero, that is, when a zero voltage is output from the single-phase inverter 11 will be described. When the inverter output voltage becomes zero after the positive inverter output voltage is generated, a current flows in a freewheeling mode in which a current flows between the single-phase inverter 11 and the single-phase motor 12 without current flowing from a power supply side, as indicated by thick solid line (c) in FIG. 13. More specifically, the direction of the current having flowed through the single-phase motor 12 immediately before that freewheeling mode is unchanged, such that the current flows out of the single-phase motor 12 and returns to the single-phase motor 12 through the channel of the switching element 54 which is the lower arm of the second phase and the body diode 52a of the switching element 52 which is the lower arm of the first phase. When the inverter output voltage becomes zero after the negative inverter output voltage is generated, the direction of the current having flowed immediately therebefore is opposite to the above direction of flow of current immediately before the inverter output voltage changes from the positive inverter output voltage to zero. As a result, as indicated by thick broken line (d) in FIG. 13, the direction of the freewheeling current is opposite to that indicated by thick solid line (c) in FIG. 13. More specifically, the current flowing out of the single-phase motor 12 returns to single-phase motor 12 through the body diode 51a of the switching element 51 which is the upper arm of the first phase and the channel of the switching element 53 which is the upper arm of the second phase.

As described above, in the freewheeling mode in which the current freewheelingly flows between the single-phase motor 12 and the single-phase inverter 11, the current flows through the body diode in either one of the first phase and the second phase. Generally, it is known that conduction loss is generally smaller when a current passes through a channel of a MOSFET than when a current passes through in a forward direction of a diode. Therefore, in the present embodiment, the MOSFET including a body diode which would allow a current to flow therethrough is controlled such that the MOSFET is turned on to thereby reduce a flow current flowing through that body diode in the freewheeling mode providing the freewheeling current flows.

The switching element 52 is controlled such that the switching element 52 is turned on at a timing of the flow of the freewheeling current indicated by thick solid line (c) in FIG. 13 in the freewheeling mode. Such control on the switching element 52 allows most of the freewheeling current to flow through the channel of the switching element 52 having a small resistance value, as indicated by thick solid line (e) in FIG. 14. Consequently, the conduction loss in the switching element 52 is reduced. In addition, the switching element 51 is controlled such that the switching element 51 is turned on at timing when the freewheeling current indicated by thick broken line (d) of FIG. 13 flows. Such control on the switching element 51 allows most of the freewheeling current to flow through the channel of the switching element 51 having a small resistance value, as indicated by thick broken line (f) in FIG. 14. Consequently, the conduction loss in the switching element 51 is reduced.

As described above, the MOSFET including a body diode is controlled such that the MOSFET is turned on at the timing when the freewheeling current flows through that body diode. As a result, the loss in the switching element can be reduced. The MOSFET, which can be controlled in the above manner, can be surface-mounted on a substrate such that heat can be dissipated on the substrate. Part or all of the switching elements are formed of wide band gap semiconductors, such that heat generation in the MOSFET is reduced only by the substrate. Note that if heat can be dissipated only by the substrate, a heat sink is not required, which contributes to reduction in size of an inverter and can lead to reduction in size of a product.

In addition to the above-described heat dissipation method, a further heat dissipation effect can be obtained by installing the substrate in the air passage. Here, the air passage is a space around a fan such as an electric blower generating an air flow, or a passage through which the wind generated by the electric blower flows. As a result of installation of the substrate in the air passage, heat in a semiconductor element on the substrate can be dissipated by the wind generated by the electric blower, so that heat generation in the semiconductor element can be significantly reduced.

Figure 16:
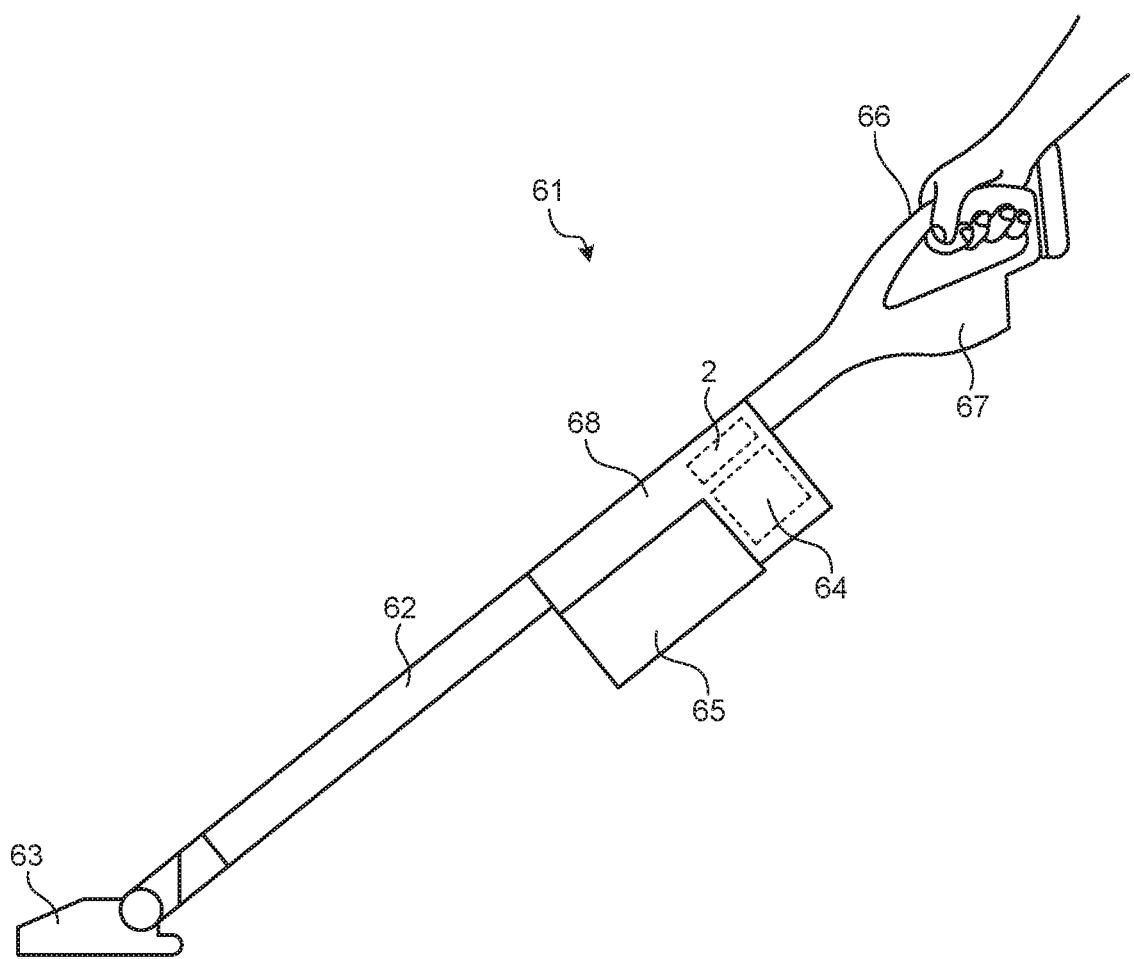
FIG. 16 is a configuration view of an electric vacuum cleaner including the motor drive device according to the embodiment of the present invention.

Next, an application example of the motor drive device according to the embodiment will be described. FIG. 16 is a configuration diagram of an electric vacuum cleaner including the motor drive device according to the embodiment of the present invention. An electric vacuum cleaner 61 includes a battery 67 which is a direct-current power supply, the motor drive device 2 illustrated in FIG. 1, an electric blower 64 driven by the single-phase motor 12 illustrated in FIG. 1, a dust collection chamber 65, a sensor 68, a suction port body 63, an extension pipe 62, and an operation portion 66. The battery 67 corresponds to the power supply 10 illustrated in FIG. 1.

A user who uses the electric vacuum cleaner 61 holds the operation portion 66 and operates the electric vacuum cleaner 61. The motor drive device 2 of the electric vacuum cleaner 61 drives the electric blower 64 by using the battery 67 as a power supply. By driving the electric blower 64, dust is sucked from the suction port body 63, and the sucked dust is collected in the dust collection chamber 65 via the extension pipe 62.

Since the electric vacuum cleaner 61 is used when the user does cleaning, standby time is longer than operating time. For a product having such a long standby time, the ratio of standby power to power consumed during operation increases as the longer the standby time increases. In particular, a drive signal generation circuit that generates a drive signal for an inverter tends to increase in standby power because a larger current flows through the drive signal generation circuit than through a circuit that generates a PWM signal flows. When the motor drive device 2 according to the present embodiment is used for such a product tending to increase in standby power, power supply to the drive signal generation circuit is stopped during stop of the operation of the electric vacuum cleaner 61. As a result, consumption of the standby power is reduced. Accordingly, discharge from the battery 67 of the electric vacuum cleaner 61 is reduced, and thus the operating time of the electric vacuum cleaner 61 can be prolonged. For the electric vacuum cleaner 61 using the motor drive device 2, in addition, the power supply switch 35 is turned off when the motor rotation speed at the time of the stop operation becomes lower than the threshold. As a result, it is possible to prevent a regenerative voltage higher than an output voltage of the battery 67 from being applied to the capacitor 3 illustrated in FIG. 2 and the battery 67. Therefore, the rise of the voltage applied to the capacitor 3 and the battery 67 is prevented, and thus the life of the capacitor 3 and the battery 67 can be extended.

Figure 17:
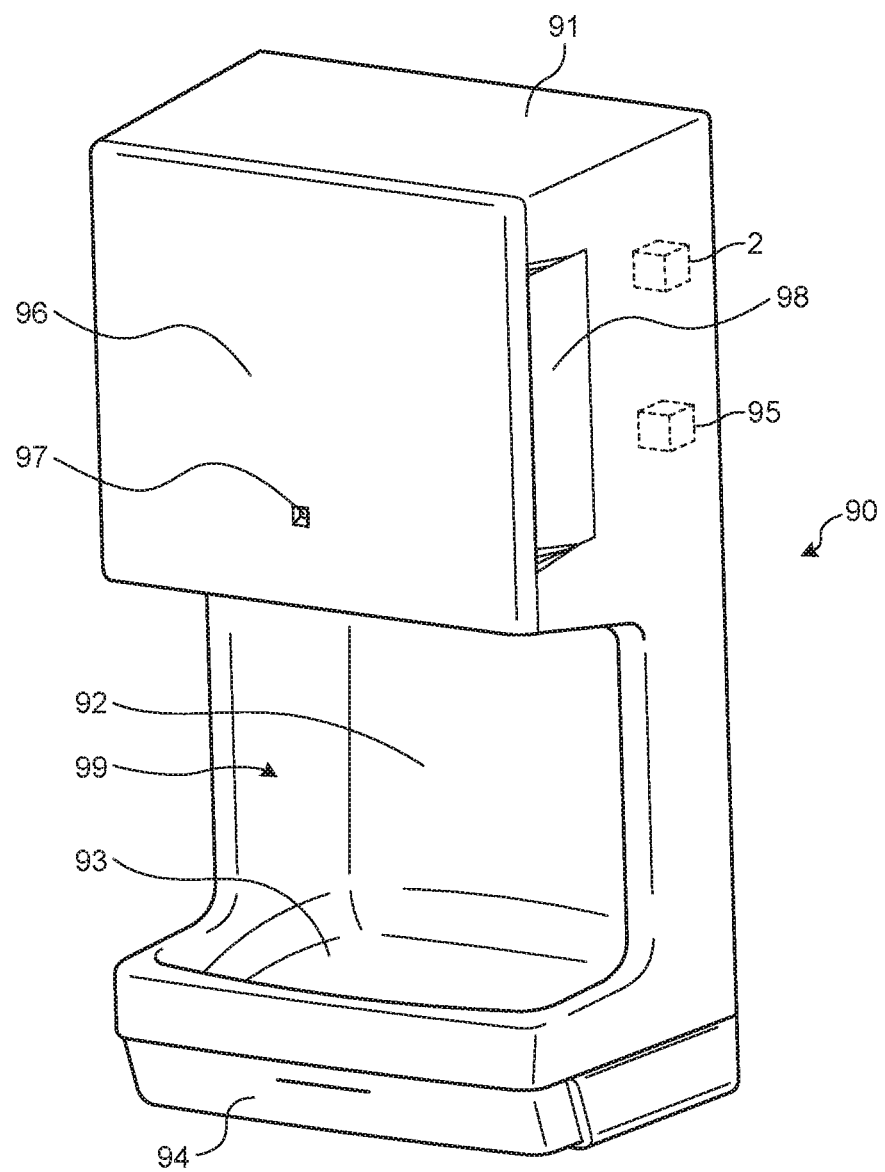
FIG. 17 is a configuration view of a hand dryer including the motor drive device according to the embodiment of the present invention.

FIG. 17 is a configuration view of a hand dryer including the motor drive device according to the embodiment of the present invention. A hand dryer 90 includes the motor drive device 2, a casing 91, a hand detection sensor 92, a water receiving portion 93, a drain container 94, a cover 96, a sensor 97, an air inlet port 98, and an electric blower 95. The sensor 97 is either a gyro sensor or a motion sensor. When the hand is inserted into a hand insertion portion 99 located above the water receiving portion 93 of the hand dryer 90, the electric blower 95 blows off water by air blow, and the blown-off water is collected in the water receiving portion 93 and then stored in the drain container 94.

Similarly to the electric vacuum cleaner 61 illustrated in FIG. 16, the hand dryer 90 is a product having standby time longer than operating time and including the electric blower 95 rotating at high speed. Therefore, the control method according to the embodiment described above is suitable for the hand dryer 90 as well, and an effect similar to that of the electric vacuum cleaner 61 can be obtained.

Figure 18:
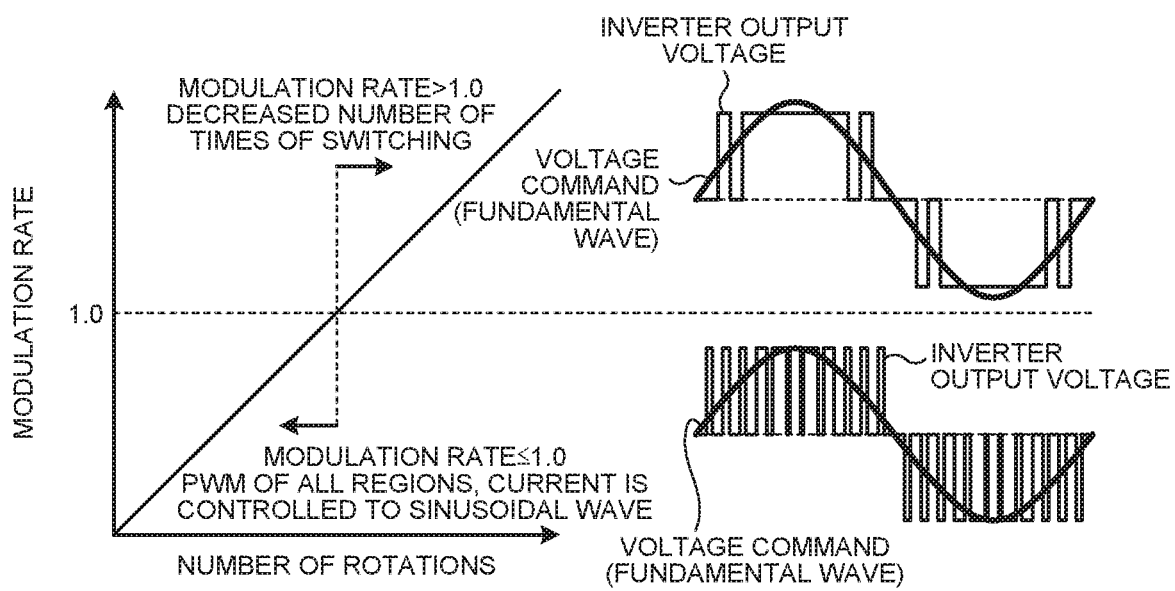
FIG. 18 is a diagram for explaining modulation control performed by the motor drive device according to the embodiment of the present invention.

FIG. 18 is a diagram for explaining modulation control performed by the motor drive device according to the embodiment of the present invention. The left side of FIG. 18 illustrates a relationship between the number of rotations and a modulation rate. The right side of FIG. 18 illustrates a waveform of an inverter output voltage when the modulation rate is 1.0 or less, and a waveform of the inverter output voltage when the modulation rate exceeds 1.0. Generally, a load torque of a rotating body increases as the number of rotations increases. For this reason, it is necessary to increase a motor output torque as the number of rotations increases. In addition, generally, the motor output torque increases in proportion to a motor current, and an increase in the motor current requires an increase in the inverter output voltage. Accordingly, the number of rotations can be increased by increasing the modulation rate and increasing the inverter output voltage.

Next, control on the number of rotations in the present embodiment will be described. The following description is based on the assumption that an electric blower is a load, and an operating range of the electric blower is divided as follows.

(A) Low-speed rotation region (region of a low number of rotations): 0 [rpm] to 100,000 [rpm]

(B) High-speed rotation region (region of a high number of rotations): 100,000 [rpm] or more A region sandwiched between (A) and (B) above is a gray area, and may be included in the low-speed rotation region or in the high-speed rotation region depending on applications.

First, the control in the low-speed rotation region will be described. In the low-speed rotation region, PWM control is performed with a modulation rate of 1.0 or less. Setting the modulation rate to 1.0 or less allows the motor current to be controlled such that the motor current provides a sinusoidal wave, and higher efficiency of the motor can be achieved. When the motor is operated using the carrier frequency common to the low-speed rotation region and the high-speed rotation region, the carrier frequency conforms to the high-speed rotation region, and therefore PWM pulses in the low-speed rotation region tends to increase more than necessary. For this reason, a method of lowering the carrier frequency in the low-speed rotation region to reduce switching loss may be used. Alternatively, control may be performed in such a way that the carrier frequency is changed in synchronization with the number of rotations, thereby preventing the number of pulses from changing in correspondence to the number of rotations.

Next, the control in the high-speed rotation region will be described. In the high-speed rotation region, the modulation rate is set to a value larger than 1.0. Setting the modulation rate to larger than 1.0 allows the inverter output voltage to increase and the number of times of switching performed by the switching elements in the inverter to decrease, thereby making it possible to reduce an increase in switching loss. The modulation rate exceeding 1.0 increases the motor output voltage, but decreases the number of times of switching, which results in concern about current distortion. However, the current distortion in the high-speed rotation region is smaller than that in the low-speed rotation region, thus lessening an effect on waveform distortion because a reactance component of the motor increases and di/dt which is a change component of the motor current decreases during high-speed rotation. Accordingly, in the high-speed rotation region, the modulation rate is set to a value larger than 1.0, and control is performed so that the number of switching pulses is reduced. By this control, an increase in switching loss can be reduced and higher efficiency can be achieved.

As described above, the boundary between the low-speed rotation region and the high-speed rotation region is ambiguous. Therefore, a first rotation speed that determines the boundary between the low-speed rotation region and the high-speed rotation region is set in the control unit 25. The control unit 25 performs control so that the modulation rate is set to 1.0 or less when the rotation speed of the motor or the load is equal to or lower than the first rotation speed, and the modulation rate is set to be exceeding 1 when the rotation speed of the motor or the load exceeds the first rotation speed.

As described above, in the present embodiment, the example configuration has been described in which the motor drive device 2 is applied to the electric vacuum cleaner 61 and the hand dryer 90, but the motor drive device 2 can be applied to an electric device on which a motor is mounted. Examples of the electric device on which a motor is mounted include an incinerator, a crusher, a dryer, a dust collector, a printing machine, a cleaning machine, a confectionery machine, a tea making machine, a woodworking machine, a plastic extruder, a cardboard machine, a packaging machine, a hot air generator, an office automation appliance, and an electric blower. The electric blower is a blowing means for object transportation, dust suction, or general blowing and exhausting.

The configurations described in the embodiment above are merely examples of the content of the present invention and can be combined with other known technology and part thereof can be omitted or modified without departing from the gist of the present invention.

The invention claimed is:

1. A motor drive device comprising:
    an inverter including a plurality of switching elements, the inverter converting a direct-current voltage output from a direct-current power supply into an alternating-current voltage by operation of the plurality of switching elements, and applying the alternating-current voltage to a motor;
    a control power supply outputting power having a voltage lower than the direct-current voltage, by using the direct-current voltage;
    a first signal generation unit driven by the power, the first signal generation unit generating drive signals driving the plurality of switching elements, and outputting the generated drive signals to the plurality of switching elements; and
    a power supply switch connected to the control power supply and the first signal generation unit,
        the power supply switch remains turned on so as to allow the control power supply to continue supplying the power through the power supply switch to the first signal generation unit to prevent a flow of regenerative current from the motor to the direct-current power supply when a rotation speed of the motor is higher than a threshold set to a rotation speed at which the direct-current voltage of the direct-current power supply is equal to an induced voltage of the motor, and
        the power supply switch is turned off so as to stop the supply of the power from the control power supply to the first signal generation unit when the rotation speed is lower than the threshold.

2. The motor drive device according to claim 1, comprising:
    an operation switch starting or stopping the inverter; and
    a second signal generation unit driven by the power, the second signal generation unit generating pulse width modulation signals for driving the plurality of switching elements, and outputting the pulse width modulation signals to the first signal generation unit, wherein
    when a stop operation of stopping the inverter is performed by the operation switch, the generation of the pulse width modulation signals by the second signal generation unit is stopped.

3. The motor drive device according to claim 2, wherein at least one of the plurality of switching elements is formed of a wide band gap semiconductor.

4. The motor drive device according to claim 3, wherein the wide band gap semiconductor is silicon carbide, gallium nitride, or diamond.

5. An electric blower comprising the motor drive device according to claim 4.

6. An electric blower comprising the motor drive device according to claim 2.

7. An electric blower comprising the motor drive device according to claim 3.

8. The motor drive device according to claim 1, wherein at least one of the plurality of switching elements is formed of a wide band gap semiconductor.

9. The motor drive device according to claim 8, wherein the wide band gap semiconductor is silicon carbide, gallium nitride, or diamond.

10. An electric blower comprising the motor drive device according to claim 9.

11. An electric blower comprising the motor drive device according to claim 8.

12. An electric blower comprising the motor drive device according to claim 1.

13. An electric vacuum cleaner comprising the electric blower according to claim 8.

14. A hand dryer comprising the electric blower according to claim 8.

* * * * *